United States Patent [19]

Jackson

[11] B 3,914,624

[45] Oct. 21, 1975

[54] CIRCUIT TO RAISE A QUANTITY TO A PREDETERMINED POWER

[75] Inventor: Harold W. Jackson, Baltimore, Md.

[73] Assignee: The Bendix Corporation, Southfield, Mich.

[22] Filed: Dec. 26, 1973

[21] Appl. No.: 428,177

[44] Published under the Trial Voluntary Protest Program on January 28, 1975 as document no. B 428,177.

[52] U.S. Cl. ................. 307/229; 307/228; 328/144

[51] Int. Cl.[2] .......................................... H03K 17/00

[58] Field of Search ............ 307/228, 229; 328/144, 328/145

[56] References Cited

UNITED STATES PATENTS

| | | | |
|---|---|---|---|
| 3,521,273 | 7/1970 | Saari | 307/229 X |
| 3,569,736 | 3/1971 | Tschinkel | 328/145 |
| 3,793,480 | 2/1974 | Waehner | 328/144 X |

*Primary Examiner*—Rudolph V. Rolinec
*Assistant Examiner*—B. P. Davis
*Attorney, Agent, or Firm*—W. G. Christoforo; Bruce L. Lamb

[57] ABSTRACT

A circuit which includes an operational amplifier generates an output current which is related to an input current raised to a predetermined power. A first diode is connected between one operational amplifier input terminal and ground and the input current injected therethrough. A second diode is resistively coupled between the second operational amplifier input terminal and ground while another resistor connects that input terminal to the operational amplifier output terminal. A further diode means is connected between the operational amplifier output terminal and ground and includes a low impedance current detector. A bias current is injected at the second diode with the result that the current flowing in the third diode means is related to the input current by a power which is determined by the operational amplifier shunt resistance and the second diode resistive coupling.

8 Claims, 2 Drawing Figures

CIRCUIT TO RAISE A QUANTITY TO A PREDETERMINED POWER

BACKGROUND OF THE INVENTION

This invention relates to analog computing circuits and in particular to an electronic circuit which will raise an input quantity to a predetermined power and which further is inherently temperature compensated.

It is well known that the junction voltage of a semiconductor PN junction diode is a logarithmic function of the current flowing therethrough. It is also known that this diode characteristic is present in various types of semiconductors. This characteristic has permitted diode junction devices to be used in various electrical circuits wherein an output signal is to be proportional to the logarithm of an input signal. Such devices have found great use particularly in computing devices of the electronic analog type. It is also known that the PN diode junction can also be used to generate an output signal which is related to the antilog of an input signal.

SUMMARY OF THE INVENTION

The present invention takes advantage of the above stated diode characteristic and in addition includes an amplifier whereby an input current related to an input quantity is converted by one diode into a signal related to the lograithm of the input quantity, the signal is then amplified and the antilog taken of the resultant amplified signal by another diode. In this manner the antilog signal becomes a signal which is related to the input signal by the degree of amplification, specifically, it is raised to a power where the power is determined by the amplification factor. In a practical embodiment of the invention the diode junctions are in the form of the diode junction of transistors arranged to be temperature compensated as will be described in the following description of the preferred embodiment.

It is thus an object of this invention to provide an electronic analog computing circuit.

It is another object of this invention to provide an electronic analog computing circuit which generates an output signal which is a predetermined power of input signal.

It is one more object of this invention to provide a circuit of the type described which is inherently temperature compensated.

These and other objects of the invention will be made plain upon a reading of the following description and the appended claims.

DESCRIPTION OF THE PREFERRED EMBODIMENT

Figure 1:
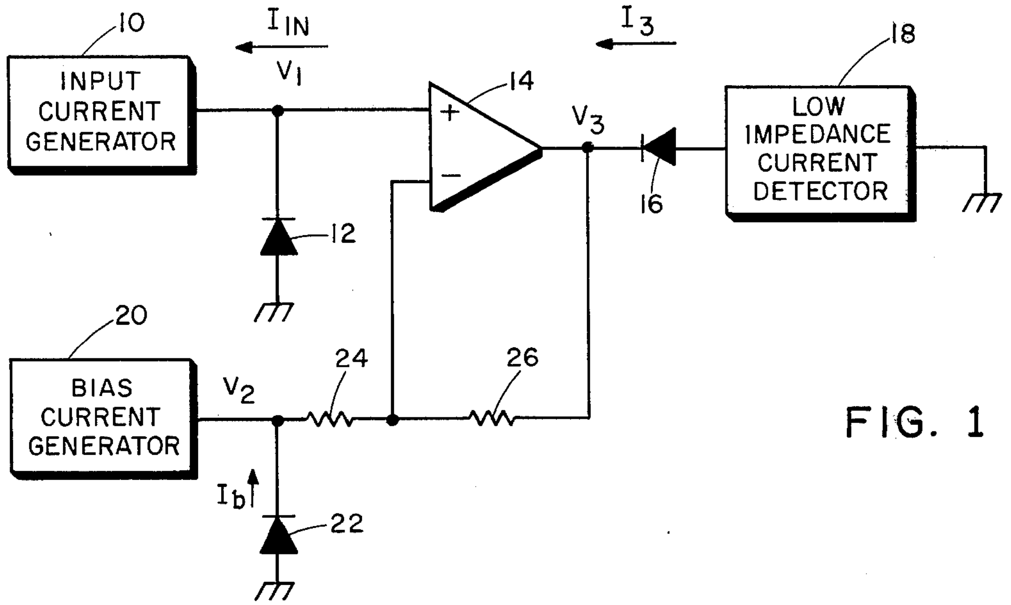
FIG. 1 is an idealized circuit diagram of the invention which is useful in explaining the principles thereof.

Refer first to FIG. 1 wherein an operational amplifier 14 has a non-inverting input terminal with a diode 12 having a cathode connected to the non-inverting input terminal and an anode connected to ground. In addition, an input current generator 10 causes an input current $I_{in}$ to be drawn through diode 12. It is assumed in this invention that the input terminals of an operational amplifier present a high input impedance and hence no current is drawn through these terminals. The current flow in diode 12 generates a voltage $V_1$ at the non-inverting input terminal.

A resistor 26 is connected between the operational amplifier inverting input terminal and its output terminal. The inverting input terminal is also coupled through a resistor 24 to the cathode of diode 22 whose anode is connected to ground. In addition, the cathode is connected to a bias current generator 20 which draws a current $I_b$ through diode 22. This current results in a voltage $V_2$ at the junction of resistor 24 with diode 22. A diode 16 is connected serially with a low impedance current detector 18 between the output terminal of operational amplifier 14 and ground. The voltage at the output terminal of operational amplifier 14 is designated $V_3$.

As aforementioned, an object of the invention is to generate an output current or voltage which is detected by detector 18 and which is proportional to a predetermined power of an input current or voltage. The following mathematical analysis will show how this is accomplished by the circuit of FIG. 1. In the mathematical analysis the following reasonable assumptions are made:

1. No current flows in any input terminal of the operational amplifier.

2. The diodes 12, 22 and 16 are ideal diodes which satisfy the diode equation:

$$I = I_s\,(e\;qv/KT - 1\;) \qquad (1)$$

where I is the total current of the idealized PN junction diode, $I_s$ represents the diode saturation current, $e$ is the magnitude of the electronic charge, $v$ is the voltage drop across the diode junction, K represents Boltzmann's constant, and T is the absolute temperature of the diode junction.

3. All the diodes are identical so that the saturation current $I_s$ is the same for all diodes.

4. For the currents involved in a practical application of the invention equation 1 can be approximated:

$$I = I_s\, e\; qv/KT \qquad (2)$$

or $$V = KT/q\; 1n\; (I/I_s). \qquad (3)$$

5. The various diodes are mounted in any suitable manner for exposing them to the same ambient temperature environment, such as by mounting them on a common heat sink and/or common encapsulation in heat conducting material, or any other means well known in the art.

Voltage $V_3$ is related to $V_1$ and $V_2$ as follows:

$$V_3 = V_1(R_{24} + R_{26}/R_{24}) - V_2(R_{26}/R_{24})$$
$$V_3 = aV_1 - bV_2 \qquad (4)$$

where $$a = R_{24} + R_{26}/R_{24}$$
$$b = R_{26}/R_{24}$$

and where $R_{24}$ is the resistance of resistor 24 and $R_{26}$ is the resistance of resistor 26.

Voltages $V_1$ and $V_2$ are related respectively to input current $I_{in}$ and $I_b$ as follows:

$$V_1 = KT/g\ 1n\ (I_{in}/I_s) \quad (5)$$

$$V_2 = KT/q\ 1n\ (I_b/\ I_s) \quad (6)$$

Substituting equations (5)and (6) into equation (4) produces:

$$V_3 = a\ KT/q\ 1n\ (I_{in}/I_s) - b\ KT/q\ 1n\ (I_b/I_s) \quad (7)$$

The resulting current flowing in diode 16 is of course related to voltage $V_3$ as follows:

$$I_3 = I_s l^{\ V_3q/KT} \quad (8)$$

Substituting the value of $V_3$ of equation (7) into equation (8) results in the cancellation of $q$, K and T terms and produces:

$$I_3 = I_s[l^{\ a\ 1n\ (I_{in}/I_s)}]/[l^{b\ 1n\ (I_b/I_s)}]$$
$$= I_s\ (I_{in}/I_s)\ a\ /(I_b/I_s)^{\ b} \quad (9)$$

however, since:

$$b = a - 1$$

then:

$$I_3 = I_{in}{}^{a}/I_s\ a \times I_s{}^{a\ -1}/I_b\ b \times I_s = I_{in}{}^{a}/I_b{}^{a\ -1}$$

It can thus be seen that where the bias current $I_b$ is maintained constant the current in diode 16, that is the current $I_3$, will be proportional to the input current $I_{in}$ raised to a predetermined power where the predetermined power is the amplification factor of the operational amplifier 14. In essence, what has been done is that the logarithm has been taken of the input current by diode 12, this current has been amplified by the operational amplifier, that is the logarithm of the input signal has been multiplied by the factor of amplification, with the antilog of the resulting amplified signal being taken by diode 16 to accomplish the objects of the invention.

Figure 2:
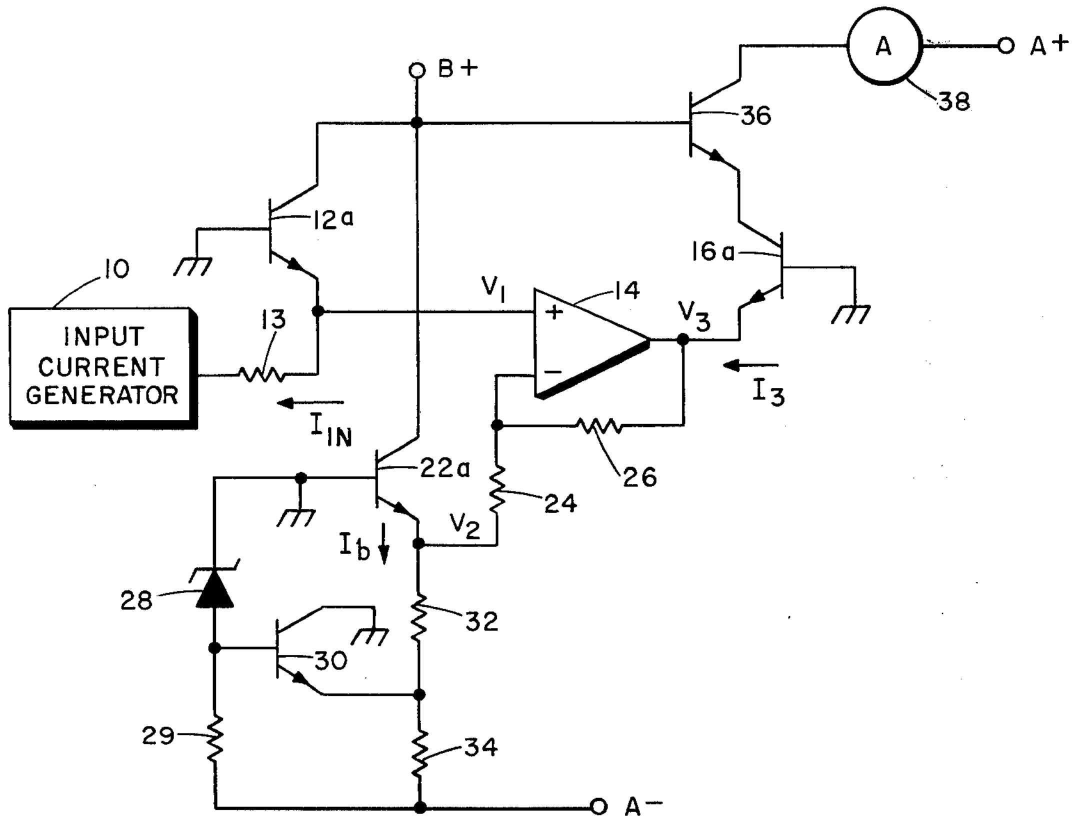
FIG. 2 is a circuit diagram of a practical form of the invention.

Refer now to FIG. 2 which illustrates a practical embodiment of the invention and wherein elements suitably identical to elements of FIG. 1 are identified by the same numerals. In this embodiment operational amplifier 14 has its non-inverting input terminal connected directly to the emitter-electrode of NPN transistor 12*a* whose base electrode is connected to ground so that the base-emitter junction of this transistor is fully equivalent to diode 12 of FIG. 1. The inverting input terminal of operational amplifier 14 is connected through resistor 24 to the emitter-electrode of NPN transistor 22*a* whose base electrode is likewise grounded so that the base-emitter junction of this transistor is fully equivalent to diode 22 of FIG. 1. As before, resistor 26 is connected in feedback relationship between the output terminal of the operational amplifier and its inverting input terminal. The output terminal of operational amplifier 14 is connected to the emitter-electrode of NPN transistor 16*a* whose base electrode is likewise connected to ground. The base-emitter junction of this transistor is fully equivalent to diode 16 of FIG. 1. The collector electrode of transistor 16*a*is connected to the emitter-electrode of NPN transistor 36 whose base electrode is connected in common with the collector electrode of transistor 12*a* to a B+ voltage terminal, wherein B+ is a voltage between A+ and ground. The collector electrode of transistor 36 is connected through ammeter 38 to an A+ voltage terminal. The connection of transistor 16*a* and 36 together with ammeter 38 comprise the low impedance current detector of FIG. 1.

The collector electrode of transistor 22*a* is likewise connected to the B+ voltage terminal. In addition, the emitter-electrode of transistor 22*a* is connected through the serial arrangement of resistors 32 and 34 to an A− voltage terminal, with the junction between these two resistors being connected to the emitter electrode of NPN transistor 30 whose collector electrode is connected to ground and whose base electrode is connected through resistor 29 to the A− voltage terminal. A Zener diode 28 is connected between the base electrode of transistor 30 and ground.

It will be noted that a constant current $I_b$ flows in the base-emitter junction of transistor 22*a*. This is accomplished essentially by the connection of transistor 30 which maintains a constant voltage across resistor 32, this voltage being equal to the voltage drop across Zener diode 28. In addition, transistors 30 and 22*a* are matched so that variations in temperature produce identical variations across the base-emitter junctions to maintain identical variations across the base-emitter junctions to maintain the aforementioned voltage drop across resistor 32 constant even though the temperature may vary. This action, of course, results in the generation of the voltage $V_2$ at the emitter-electrode of transistor 22*a*. In this embodiment, transistor 30 and Zener diode 28 together with resistors 29, 32 and 34 are equivalent to the bias current generator 20 of FIG. 1.

It will be noted that voltage $V_3$ is approximately equal to voltage $V_2$ since they are both one diode drop above ground. Of course, there is some difference between $V_2$ and $V_3$ but this difference is so small that only a minute and insignificant current flows therebetween and almost all of current $I_b$ flows through the base-emitter junction of transistor 22*a*. If this small current flow between $V_3$ and $V_2$ is objectionable, a unity amplifier (not shown) having a high input impedance can be provided between the emitter of transistor 22*a* and resistor 24 with the emitter connected to the amplifier input and resistor 24 being connected to the amplifier output. In this case, the additional amplifier output terminal comprises a voltage terminal on which $V_2$ is reproduced. There will then be practically no current contribution to $I_b$ due to $V_3$. In any event, almost all of current $I_3$ flows into the output terminal of operational amplifier 14 which comprises a voltage terminal therefor.

The input current $I_{in}$ is drawn through the base-emitter junction of transistor 12*a* and through resistor 13 by the input current generator 10. It should be obvious that the input current generator 10 may be any device which sets the input current to the desired level, and in its simplest form might comprise a potentiometer and an ammeter for setting the input current. Other forms of the input current generator should immediately suggest themselves to one skilled in the art. This input current, of course, produces the voltage $V_1$ at the non-inverting input terminal of operational amplifier 14.

In a circuit actually built, the various transistors were formed in the same monolithic block and thus were closely matched to one another and exposed to the same temperature environment.

From a reading and understanding of the above description and drawings, one skilled in the art should now be able to produce the invention. In addition, certain obvious modifications and alterations in the invention might suggest themselves to one skilled in the art. Accordingly, the invention is to be limited only by the true scope and spirit of the appended claims.

The invention claimed is:

1. A circuit for raising a quantity to a predetermined power comprising:
- an operational amplifier having first and second high impedance input terminals and an output terminal:
- a first constant voltage terminal;
- first diode means for connecting said first terminal to said first constant voltage terminal;
- first resistor means for connecting said second terminal to said output terminal;
- a bias current terminal;
- second resistor means for connecting said second terminal to said bias current terminal;
- a second constant voltage terminal;
- second diode means for connecting said bias current terminal to said second constant voltage terminal;
- a third constant voltage terminal;
- third diode means for connecting said operational amplifier output terminal to said third constant voltage terminal;
- means for injecting a bias current at said bias current terminal, said bias current thereby flowing in said third diode means;
- means for injecting an input current at said first input terminal, said input current being related to said quantity to be raised to a predetermined power, and the resultant current through said third diode means being thereby related to the quantity as raised to said predetermined power.

2. The circuit of claim 1 wherein said third diode means includes means for detecting the quantity of current flowing therethrough.

3. The circuit of claim 1 wherein said first, second and third constant voltage terminals comprise a common constant voltage terminal.

4. The circuit of claim 1 wherein said first resistor means comprises a first resistance and wherein said second resistor means comprises a second resistance, the relationship of said first resistance with respect to said second resistance thereby determining said predetermined power.

5. The circuit of claim 1 wherein said first diode means comprises a transistor having an emitter-electrode connected to said first terminal and a base electrode connected to said first constant voltage terminal, and wherein said second diode means comprises a second transistor having an emitter-electrode connected to said bias current terminal and a base electrode connected to said second constant voltage terminal, and wherein said third diode means comprises a third transistor having an emitter-electrode connected to said operational amplifier output terminal and a base electrode connected to said third constant voltage terminal, and wherein said first, second and third constant voltage terminals comprise a common constant voltage terminal.

6. The circuit of claim 5 wherein said means for injecting a bias current in said bias current terminal includes a resistor having one end connected to said bias current terminal and means for maintaining a constant voltage across said resistor.

7. The circuit of claim 1 wherein said means for injecting a bias current is constructed so that the bias current flowing in said second diode means remains constant.

8. The circuit of claim 2 wherein said first, second and third constant voltage terminals comprise a common constant voltage terminal and wherein said first diode means comprises a first transistor having a base electrode and an emitter-electrode connected to said first terminal, and wherein said second diode means comprises a second transistor having a base electrode and an emitter-electrode connected to said bias current terminal and wherein said third diode means comprises a third transistor having a base electrode and an emitter-electrode connected to said operational amplifier output terminal, the base electrodes of said first, second and third transistors being connected to said common constant voltage terminal, and wherein said third transistor includes a collector emitter circuit and wherein said means for detecting the quantity of current comprises a low impedance means for detecting the current flowing in said collector emitter circuit.

* * * * *